United States Patent
Sirman et al.

(10) Patent No.: US 10,233,559 B2
(45) Date of Patent: *Mar. 19, 2019

(54) HIGH RATE ELECTRIC FIELD DRIVEN NANOELEMENT ASSEMBLY ON AN INSULATED SURFACE

(71) Applicant: Northeastern University, Boston, MA (US)

(72) Inventors: Asli Sirman, Boston, MA (US); Ahmed Busnaina, Needham, MA (US); Cihan Yilmaz, Boston, MA (US); Jun Huang, Malden, MA (US); Sivasubramanian Somu, Natick, MA (US)

(73) Assignee: Northeastern University, Boston, MA (US)

( * ) Notice: Subject to any disclaimer, the term of this patent is extended or adjusted under 35 U.S.C. 154(b) by 32 days.

This patent is subject to a terminal disclaimer.

(21) Appl. No.: 15/350,636

(22) Filed: Nov. 14, 2016

(65) Prior Publication Data
US 2017/0058422 A1    Mar. 2, 2017

Related U.S. Application Data

(63) Continuation of application No. 14/838,930, filed on Aug. 28, 2015, now Pat. No. 9,497,855, which is a (Continued)

(51) Int. Cl.
*C25D 13/22* (2006.01)
*H05K 1/03* (2006.01)
(Continued)

(52) U.S. Cl.
CPC .............. *C25D 13/22* (2013.01); *B82Y 40/00* (2013.01); *C09D 5/4407* (2013.01);
(Continued)

(58) Field of Classification Search
CPC ........ C25D 13/22; C25D 13/04; C25D 13/12; C25D 13/20; B82Y 40/00; C09D 5/4407;
(Continued)

(56) References Cited

U.S. PATENT DOCUMENTS

| 4,728,591 A | 3/1988 | Clark |
| 7,752,997 B1 | 7/2010 | Carnahan |

(Continued)

FOREIGN PATENT DOCUMENTS

WO    WO2010087853 A1    8/2010

OTHER PUBLICATIONS

Yilmaz et al. "Large-Scale Nanorods Nanomanufacturing by Electric-Field-Directed Assembly for Nanoscale Device Applications," IEEE Transactions on Nanotechnology, vol. 9, No. 5 pp. 653-658 (2010).

*Primary Examiner* — Timothy J Thompson
*Assistant Examiner* — Charles Pizzuto
(74) *Attorney, Agent, or Firm* — Arent Fox LLP

(57) ABSTRACT

A method for high rate assembly of nanoelements into two-dimensional void patterns on a non-conductive substrate surface utilizes an applied electric field to stabilize against forces resulting from pulling the substrate through the surface of a nanoelement suspension. The electric field contours emanating from a conductive layer in the substrate, covered by an insulating layer, are modified by a patterned photoresist layer, resulting in an increased driving force for nanoelements to migrate from a liquid suspension to voids on a patterned substrate having a non-conductive surface. The method can be used for the production of microscale and nanoscale circuits, sensors, and other electronic devices.

11 Claims, 7 Drawing Sheets

Related U.S. Application Data continuation of application No. 13/990,388, filed as application No. PCT/US2011/062395 on Nov. 29, 2011, now Pat. No. 9,145,618.

(60) Provisional application No. 61/417,658, filed on Nov. 29, 2010.

(51) Int. Cl.

| | | |
|---|---|---|
| *H05K 1/09* | (2006.01) | |
| *H05K 3/12* | (2006.01) | |
| *C25D 13/12* | (2006.01) | |
| *C25D 13/04* | (2006.01) | |
| *C25D 13/20* | (2006.01) | |
| *C09D 5/44* | (2006.01) | |
| *C09D 125/06* | (2006.01) | |
| *B82Y 40/00* | (2011.01) | |
| *H05K 1/02* | (2006.01) | |
| *H01L 21/02* | (2006.01) | |
| *H01L 29/06* | (2006.01) | |
| *B82Y 30/00* | (2011.01) | |

(52) U.S. Cl.
CPC ......... *C09D 5/4488* (2013.01); *C09D 125/06* (2013.01); *C25D 13/04* (2013.01); *C25D 13/12* (2013.01); *C25D 13/20* (2013.01); *H05K 1/0213* (2013.01); *H05K 1/0306* (2013.01); *H05K 1/092* (2013.01); *H05K 3/1258* (2013.01); *B82Y 30/00* (2013.01); *H01L 21/0243* (2013.01); *H01L 21/0259* (2013.01); *H01L 21/02628* (2013.01); *H01L 29/0665* (2013.01); *Y10S 977/882* (2013.01); *Y10S 977/892* (2013.01)

(58) Field of Classification Search
CPC .. C09D 5/4488; C09D 125/06; H05K 1/0213; H05K 1/0306; H05K 1/092; H05K 3/1258
USPC .......................................... 204/622; 174/250
See application file for complete search history.

(56) References Cited

U.S. PATENT DOCUMENTS

| | | |
|---|---|---|
| 8,003,173 B2 | 8/2011 | Choi et al. |
| 8,142,984 B2 | 3/2012 | Penner et al. |
| 9,145,618 B2* | 9/2015 | Sirman .................. B82Y 40/00 |
| 2005/0061451 A1 | 3/2005 | Busnaina et al. |
| 2005/0133372 A1 | 6/2005 | Zhou et al. |
| 2007/0119372 A1 | 5/2007 | Tai et al. |
| 2008/0011714 A1 | 1/2008 | Yokoi et al. |
| 2008/0292805 A1 | 11/2008 | Tamura et al. |
| 2009/0087622 A1* | 4/2009 | Busnaina ............ B81C 1/00031 428/173 |
| 2009/0127224 A1* | 5/2009 | Takeuchi ............... B82Y 10/00 216/11 |
| 2009/0134033 A1 | 5/2009 | Mead et al. |
| 2009/0197209 A1 | 8/2009 | Penner et al. |
| 2010/0116631 A1 | 5/2010 | Somu et al. |
| 2010/0190112 A1 | 7/2010 | Wakiya et al. |
| 2011/0220171 A1 | 9/2011 | Mathai et al. |
| 2012/0326310 A1 | 12/2012 | Busnaina |
| 2014/0227722 A1 | 8/2014 | Malima et al. |

* cited by examiner

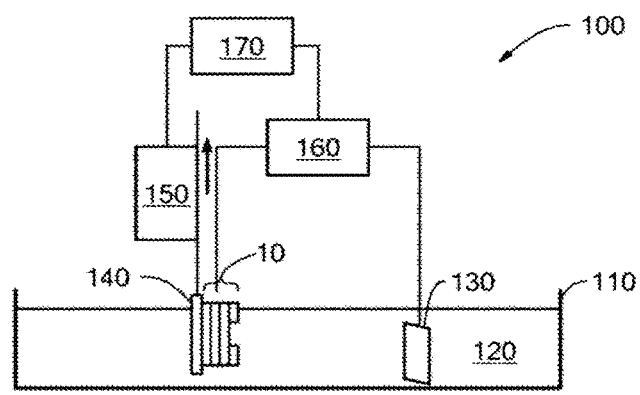
FIG. 3
FIG. 4A
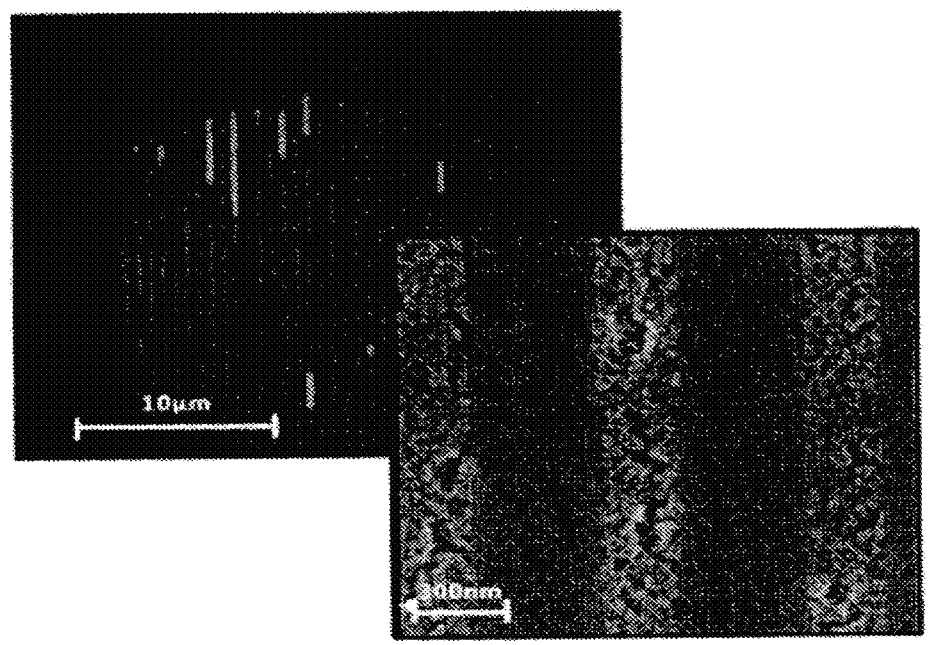
FIG. 4B

HIGH RATE ELECTRIC FIELD DRIVEN NANOELEMENT ASSEMBLY ON AN INSULATED SURFACE

CROSS REFERENCE TO RELATED APPLICATION

This application is a continuation of U.S. application Ser. No. 14/838,930, filed Aug. 28, 2015, which is a continuation of U.S. application Ser. No. 13/990,388, filed May 29, 2013, issued as U.S. Pat. No. 9,145,618, which is the U.S. national phase application of PCT/US11/62395, filed Nov. 29, 2011, which claims the priority of U.S. Provisional Application No. 61/417,658 filed Nov. 29, 2010, all of which are hereby incorporated by reference.

STATEMENT REGARDING FEDERALLY SPONSORED RESEARCH

The invention was made with support from Grant EEC-0425826 from the National Science Foundation Nanoscale Science and Engineering Center. The United States Government has certain rights in the invention.

BACKGROUND

Nanoelements have generated much interest due to their potential use in devices requiring nanoscale features such as new electronic devices, sensors, photonic crystals, advanced batteries, and many other applications (1,2). The realization of commercial applications, however, depends on developing high-rate and precise assembly techniques to place these elements onto desired locations and surfaces.

Different approaches have been used to carry out directed assembly of nanoelements in a desired pattern on a substrate, each approach having different advantages and disadvantages. In electrophoretic assembly, charged nanoelements are driven by an electric field onto a patterned conductor. This method is fast, with assembly typically taking less than a minute; however, it is limited to assembly on a conductive substrate (3). Directed assembly can also be carried out onto a chemically functionalized surface. For example, treatment to render a surface more hydrophilic can lead to selective assembly of nanoelements on the treated area (4,5). However, such assembly is a slow process, requiring up to several hours, because it is diffusion limited (6-9). Thus, there remains a need for a method of nanoelement assembly that is both rapid and not reliant on having either a conductive surface or a chemically functionalized surface.

SUMMARY OF THE INVENTION

The invention provides methods and materials for high rate assembly of nanoelements into two-dimensional patterns on a substrate for the production of microscale and nanoscale circuits and other electronic devices. The methods utilize the electric field contours emanating from a conductive layer covered by an insulating layer and a patterned photoresist layer to drive nanoelements from a liquid suspension to selected assembly sites on the insulating layer surface. The continued application of the electric field allows the assembled nanoelements to be rapidly withdrawn from the suspension in an assembled state.

One aspect of the invention is a method for assembling nanoelements. The method includes the steps of: providing a patterned substrate having a base nonconducting layer, a conducting layer on the base layer, an insulated layer on the conducting layer, and a patterned layer on the insulating layer; submerging at least a portion of the substrate into a liquid suspension of nanoelements, the suspension interfacing with a gaseous medium, such as air, at a surface of the suspension; and pulling the submerged portion of the substrate through the surface of the suspension while applying an electrical potential between the conducting layer and a counter electrode in the suspension. The patterned layer contains one or more voids, whose walls are formed by the patterned layer and whose bottom is formed by the insulating layer. As a result of the method, nanoelements from the suspension are assembled in the voids and deposited on the insulating layer of the patterned substrate.

Another aspect of the invention is a patterned substrate for use with the nanoelement assembly method. The patterned substrate includes a base layer, a conducting layer above the base layer, an insulating layer above the conducting layer, and a patterned layer above the insulating layer. The patterned layer is interrupted according to a pattern that defines one or more voids therein. The patterned layer forms the walls of the voids, and the insulating layer forms the bottom of the voids. The thickness of the insulating layer is selected so as to provide selective assembly of the nanoelements within the voids during the nanoelement assembly method, leaving other surfaces of the patterned substrate essentially devoid of nanoelements.

Still another aspect of the invention is a method of making the patterned substrate. The method includes the steps of: depositing a conductive layer on a base layer of nonconducting material; depositing a nonconductive layer on the conductive layer; depositing a photoresist layer on the insulating layer; and performing lithography to remove one or more portions of the photoresist layer to create a pattern of voids in the photoresist layer, whereby a patterning layer is formed, the patterning layer comprising a pattern of voids, the walls of the voids formed by the patterning layer and the bottom of the voids formed by the insulating layer.

Yet another aspect of the invention is a device for assembling nanoelements according to the method described above. The device includes a chamber for containing a suspension of nanoelements, a counter electrode disposed within the chamber, and a movable platform adapted for mounting a patterned substrate. The movable platform is attached to a drive capable of pulling the platform through the surface of the suspension at a speed adjustable from about 0.5 to about 10 mm/min.

BRIEF DESCRIPTION OF THE DRAWINGS

FIG. 3 shows a diagram of an apparatus for carrying out a nanoelement assembly method according to the invention.

FIGS. 4A and 4B show a scanning electron micrograph (SEM) of an assembly result using a pulling speed of 3 mm/min and an applied voltage of 3.4 V using polystyrene latex nanoparticles of 48 nm average size. FIG. 4A shows a low magnification image, and FIG. 4B shows a high magnification image. In FIG. 4B the assembled nanoparticles can be discerned.

DETAILED DESCRIPTION OF THE INVENTION

Electrophoresis of nanoelements is known to produce rapid assembly of the nanoelements onto an electrically conductive surface which serves as an electrode. However, assembly of nanoelements onto a nonconductive surface is normally limited by the rate of diffusion of the nanoelements through a liquid suspension to the surface, resulting in assembly rates orders of magnitude slower than electrophoresis. The present inventors have discovered that application of an electric field unexpectedly enhances the rate of nanoelement assembly onto a substrate covered with an electrical insulator at the assembly surface as the surface is pulled through the surface of a liquid suspension of nanoelements.

While electrophoresis requires the production of a patterned electrode, leaving a bare conductor exposed to the solution and subject to complications such as chemical corrosion, contamination, and delamination, the new method of the present invention can drive the rapid and directed (i.e., patterned) assembly of nanoelements without the need to create a patterned electrode. The new method can drive the assembly of nanoelements using a continuous, unpatterned conductive layer covered by a continuous, unpatterned insulating layer of selected thickness. Patterning of the assembled nanoelements can be determined by a patterned layer deposited onto the insulating layer. The patterned layer can be fabricated from a photoresist material and patterned by a lithography method in fewer steps than are required to fabricate a patterned conductive electrode. The result of the assembly method of the present invention is a rapidly fabricated patterned assembly of nanoelements deposited onto a nonconductive surface.

Figure 1:
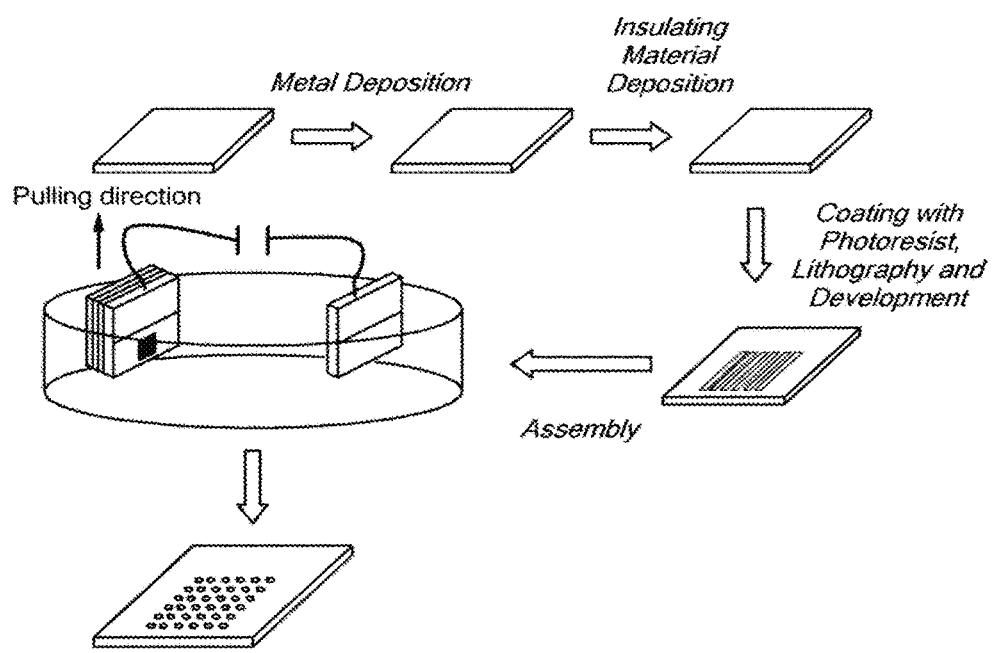
FIG. 1 shows a diagrammatic representation of a method of assembling nanoelements according to the invention.

The assembly method is summarized in FIG. 1. A patterned nanosubstrate is made by depositing a conductive layer, such as a metal, onto a base layer, depositing an insulating material onto the conductive layer, and coating the insulating layer with a photoresist layer. The photoresist layer is subjected to lithography, whereby a pattern of voids is created to form a patterned uppermost layer. Assembly is then carried out by placing the patterned substrate into a liquid suspension of nanoelements in a container, and lifting the substrate through the surface of the suspension while applying a voltage between the conductive layer of the substrate and a counter electrode in the suspension. As a result, nanoelements are assembled from the suspension to fill the patterned voids on the substrate.

Figure 2:
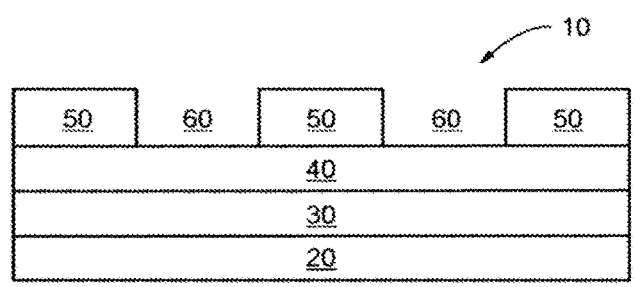
FIG. 2 shows a cross section of a patterned substrate for the assembly of nanoelements.

According to one embodiment of the invention, a patterned substrate is provided for carrying out the electrophoretic assembly of nanoelements on a non-conductive surface. A diagram of the substrate is shown in FIG. 2. Patterned substrate 10 includes base layer 20, conductive layer 30 above the base layer, insulating layer 40 above the conducting layer, and patterned layer 50 above the insulating layer. The patterned layer is interrupted according to a pattern that defines one or more voids 60 in the patterned layer for the assembly of nanoelements. The patterned layer material forms the sidewalls of the voids, while the underlying insulating layer forms the bottom or floor of the voids. Assembly takes place on the bottom of the voids and is laterally limited by the presence of the sidewalls. The thickness of the insulating layer, together with the geometry of the voids, leads to the desired electric field contours that direct the assembly of nanoelements within the voids during electrophoresis. The electric field contour results in selective nanoelement assembly method in the voids, leaving other surfaces of the patterned substrate, outside the voids, essentially free or even entirely devoid of nanoelements.

The patterned substrate can be fabricated by depositing a conductive layer on a base layer of nonconducting material, then depositing a nonconductive layer on the conductive layer, and then depositing a photoresist layer on the insulating layer. Finally, the photoresist layer is patterned by performing lithography to remove one or more portions of the photoresist layer, thereby creating a pattern of voids in the photoresist layer. In some embodiments, the patterned substrate consists only or essentially of the base layer, conductive layer, insulating layer, and patterned layer. In other embodiments, additional materials or layers can be added in between, above, or below those layers. For example, an optional adhesion layer can be added between the base layer and the conductive layer to improve adhesion of the conductive layer and reduce the tendency for delamination during electrophoresis. With respect to the insulating and patterned layer, in some embodiments they are separate and distinct layers, made of different materials and in different steps of the method of fabrication. In other embodiments, the insulating and patterned layers are combined into a single structure, which has a lower portion that covers the conductive layer and forms the bottom or floor of the voids, and an upper portion that is interrupted by the pattern that forms the voids. Such a combined patterned insulating layer can be formed, for example, by an imprinting method (e.g., nanoimprinting), in which a single layer of insulating material is formed followed by removal of a portion of the upper portion thereof to form a pattern of voids (patterned layer) underlayered by a continuous insulating layer.

The base layer can be any supportive and non-conductive material suitable for depositing a conductive layer thereon. It provides mechanical support for the rest of the materials in the patterned substrate and also insulates the conductive layer on the side opposite from assembly. The base layer can be rigid or it can be flexible. Suitable materials include silicon, silicon dioxide, a metal oxide such as alumina or titania, sapphire, silicon carbide, other inorganic or ceramic materials, semiconductor materials, and non-conductive organic polymers. The base layer can be formed by known methods, including molding, polymerization, cutting from a block or ingot, polishing, and various physical and chemical deposition methods. The dimensions of the base layer can be determined by the particular application. In general, the base layer is thicker than the other layers of the patterned substrate, and may be thicker than all the other layers combined. Most applications will require that the base layer, and the overall patterned substrate, have an approximately planar shape and a surface area of at least 1, 10, 100, or 1000 or more $\mu m^2$. The thickness of the base layer can be at least 100 nm, 500 nm, 1 µm, 10 µm or more. The base layer of the patterned substrate can also be a portion of a larger device that can have any desired shape or dimensions.

The conductive layer is a thin layer of a conductive metal, metal alloy, or a conductive polymer. The conductive layer covers all or a portion of the base layer and can be patterned or unpatterned. In some embodiments, the conductive layer covers the entire base layer and is unpatterned. Suitable metals include gold, silver, copper, chromium, aluminum, titanium, tungsten, and platinum, as well as alloys thereof. In some embodiments, the conductive layer comprises or consists of gold. In some embodiments, the conductive layer, such as gold, is deposited onto an adhesion layer of chromium. Standard processes can be used to deposit one or more metal or polymer layers on the base layer or an adhesion layer to form the conductive layer. These layers can be deposited by any method that provides a generally homogeneous, thin layer with good molecular contact and adhesion to adjacent layers. For example, chemical vapor deposition and physical vapor deposition are suitable methods for depositing metals. A preferred method for depositing metals is sputtering. Conductive polymers can be deposited by polymerization or by electrophoresis (see U.S. Published Patent Application 2009-0134033A1, which is incorporated herein by reference). Suitable conductive polymers include poly(styrenesulfonate)-poly(2,3-dihydrothieno(3,4-1,4-dioxin), polyacetylene, polydiacetylene, polypyrrole, polyanaline, polythiophene, poly(p-phenylene), polyazulene and polyquinoline. The conductive layer is a thin layer and can have a thickness, for example, in the range from about 40 nm to about 100 nm.

The insulating layer is a layer of non-conductive material deposited above or directly on the conductive layer. The material of the insulating layer can be, for example, silicon dioxide, any dielectric material, or a non-conductive polymer. A suitable dielectric material is an electrically insulating solid material that can become polarized in an electric field, such as a glass, a ceramic, or a plastic. The dielectric material of the insulating layer can be, for example, a thin layer of silicon dioxide deposited by plasma enhanced chemical vapor deposition (PECVD), or another chemical or physical deposition technique. The thickness of the insulating layer can be in the range from about 50 nm to about 5 µm, or about 50 nm to about 1 µm, such as at least 50 nm, at least 100 nm, at least 150 nm, at least 300 nm, at least 500 nm, or at least 1 µm. The assembly parameters will vary as a function of the dielectric thickness because the electric field generated at the voids depends on the thickness of the insulating layer, as well as other factors. See below for further discussion. The lateral extent of the insulating layer is typically sufficient to cover the entire conductive layer. In this way, the electric field will be uniform across the patterned substrate, and will be modified solely by the patterned layer as desired for the assembly of nanoelements.

The patterned layer can be formed of any desired electrically insulating material. A convenient material is a photoresist material such as poly(methylmethacrylate) (PMMA), which is electrically insulating and can be patterned using a lithographic method. Lithographic methods are well known, and can be selected based on the size of the pattern features. For example, pattern features in the nm range can be created using electron beam lithography. Larger scale features, in the micron range, can be created using photolithography. If it is desired to transfer the assembled nanoelements from the patterned substrate where they are created to another substrate, then the patterned layer should be fabricated from a material that can be readily removed without disrupting the assembled nanoelements or the underlying layers. For example, PMMA can be dissolved using acetone, leaving the assembled nanoelements resting on a silicon dioxide insulating layer, ready for transfer to another substrate, where they can be integrated into a circuit or sensor. The thickness of the patterned layer is less crucial than that of the insulating layer in terms of its effect on the electric field strength. As the simulations presented below demonstrate, the field is highest within the voids, near the insulating layer. However, the patterned layer also serves to laterally concentrate the field within the voids, and also contributes to the driving force for assembly. Therefore, the patterned layer can be deposited initially at a thickness in a similar range as the thickness of the insulating layer, i.e., about 50 nm to about 5 µm or more. Following lithography, the thickness of the patterned layer will be reduced to essentially zero within the voids, and between the voids may remain at its original thickness. The thickness of the patterned layer generally will become the depth of the voids. The patterned layer can be deposited by known methods, such as methods for depositing photoresist materials. A preferred method is spin coating.

In certain embodiments the patterned layer and the insulating layer can be merged into a single layer. For example, a photoresist material can also serve as an electrically insulating material for the insulating layer. In such embodiments, the assembly pattern can be created in the combined insulating patterned layer using an imprinting method, such as nanoimprinting (10), which removes material from the combined layer to a desired depth to form the voids, leaving sufficient insulating material to cover the conductive layer and provide the appropriate electric field for assembly.

The patterned layer contains one or more voids, or empty spaces in the patterned layer, which are intended as the locations for nanoelement assembly. The voids can form a two-dimensional pattern that serves as the basis for a circuit, a portion of a circuit, or as a sensor, or other component of a nanoscale or microscale electronic or electromechanical device. The assembly method is capable of achieving assembly of nanoelements in voids that define any desired two-dimensional pattern, including any desired geometric shapes, or networks of trenches or lines that run vertically, horizontally, or diagonally, or that intersect with other trenches, lines, or geometric figures. The lateral dimensions of the voids, and of the resulting assembled nanoelement features, can be any desired size in the nanoscale (from about 1 to about 999 nm) or microscale (from about 1 to about 999 µm) range, or even larger. The depth of the voids is determined by the thickness of the patterned layer.

Many different types of nanoelements can be assembled using the method of the present invention. These include nanoparticles, nanorods, nanotubes, nanocrystals, dendrimers, nanowires; biological materials, including protein molecules (native or recombinant), antibodies, nucleic acid molecules, polysaccharide molecules, lipids, complexes of such molecules and mixtures of such molecules; cells, lipid vesicles, and native or recombinant virus particles; quantum dots; and organic nanotubes. Preferred nanoelements are single-walled carbon nanotubes and nanoparticles. Nanoelements having an elongated shape can be assembled within nanotrenches in an aligned or partially aligned fashion by limiting the width of the trenches. The alignment is produced by steric interaction during the assembly process. See U.S. Published Patent Application 2010-0183844A1, which is hereby incorporated by reference. Nanoelements for use in the invention must be charged and possess a sufficient surface potential (zeta potential) under the conditions of assembly in order to be responsive to the applied electric field. The charge and surface potential can be manipulated for most nanoelements by controlling the pH of an aqueous nanoparticle suspension, the ionic environment (e.g., ionic strength) of the nanoparticles in suspension, and the solvent used for the nanoparticle suspension (solvent polarity). These influences are well known and can be adjusted as needed to optimize the assembly process.

The patterned substrate is contemplated for use in a nanoelement assembly method that relies on electrophoresis to counteract shear forces at the air-water interface of a solution which tend to disrupt the assembled structures. In the absence of an electric field, removal of a substrate containing assembled nanoelements through the surface of a liquid suspension is believed to promote the removal of the assembled nanoelements from the substrate. Without intending to limit the invention to any particular mechanism, it is believed that in the present assembly method the nanoelements are rapidly (within seconds) assembled on the submerged patterned substrate in the presence of the applied electric field, and that the field must be continuously applied during removal of the substrate through the suspension surface, i.e., through a liquid-gas interface, in order to prevent shear forces from disrupting and removing the assembled nanoelements. In order to prevent such disruption, a previous method required the substrate to be chemically treated to promote the adhesion of the nanoelements and withdrawn very slowly (e.g., 0.1 mm/min) from the suspension. See U.S. Published Patent Application 2010-0183844A1. The present invention dramatically speeds up the withdrawal process and maintains the assembled nanoelement structures through the use of an electric field that is applied prior to and during removal of the substrate.

The patterned substrate is also contemplated for use in devices which require nanoelements to be assembled on a non-conductive surface material. This is a requirement for certain applications, such as quantum dot memory, single walled nanotube transistors, and single electron devices. The substrate can also be used to prepare biosensors that lack any exposed metal. For example, the methods and devices described in U.S. Published Patent Application 2011-0117582A1 (hereby incorporated by reference) can be combined with the subject matter of the present invention to fabricate biosensors based on assembled nanoelements, e.g., by attaching antibodies or other biomolecules to nanoparticles.

Yet another application of the patterned substrate is as a component of a nanoelement printing system. In this application, the assembled nanoelements are transferred from the assembly substrate onto a receptor substrate. To make this possible, the affinity of the assembled nanoelements for the assembly substrate should be sufficient to maintain the assembled structure, but not so strong as to resist transfer to the receptor substrate. Here, the use of an insulating layer as the assembly surface is important, as it provides an appropriate nanoelement affinity for the subsequent transfer of the assembly.

A voltage is applied between the conductive layer of the patterned substrate and a counter electrode placed in the nanoelement suspension. The appropriate voltage can be determined by considering several additional factors that affect the rate of assembly. Those factors include the distance between the electrodes, the nanoparticle concentration, the zeta potential of the nanoparticles, the pH of the nanoparticle suspension, the nature of the solvent and the conductivity of the nanoparticle suspension, the pattern geometry of the voids where assembly takes place, and the speed with which the substrate is pulled across the surface of the nanoelement suspension.

The distance between the counter electrode and the patterned substrate (which functions at the other electrode) determines the strength of the electric field that exerts a force on the particles, causing them to migrate towards the patterned substrate. The distance between the electrodes is preferably between about 2 mm and about 5 mm, though a greater or lesser distance also can be used with suitable adjustments to the applied voltage to maintain an equivalent field strength.

In some embodiments of the assembly method the electrical potential applied is a DC potential between about 1V and about 5V, or between about 2V and 4V though higher or lower values can be used. When non-polar solvents are used in the nanopartucle suspension, much higher voltages, up to 200V, may be required to establish an electric field sufficient to drive nanoelement assembly. The potential can be constant or can vary with time during nanoelement deposition. Rapidly varying potentials, such as obtained using an AC voltage source, will tend to negate the insulating effect of the insulating layer and can dramatically alter the contour and strength of the electric field. Therefore, DC voltage is preferred. Certain fill patterns such as long horizontally oriented nanotrenches generally may deplete the pool of nanoelements at the surface of the suspension more rapidly than vertically oriented features or small, isolated features. Therefore, the speed of pulling as well as the voltage can be varied over time during assembly across a given substrate, or for one substrate compared with another, depending on the amount of horizontal pattern.

The pH of the suspension can be adjusted to an appropriate value because the pH affects the net charge and zeta potential of the nanoelements. The pH of the nanoparticle suspension can be adjusted using agents such as acids, bases, or buffering agents. For the experiments described in the Examples below, the pH was determined to be in the range from 10.6 to 11.2 (e.g., 10.6, 10.7, 10.8, 10.9, 11.0, 11.1, or 11.2). The corresponding zeta potential values over this pH range were −45 to −60 mV as measured with a Malvern Instruments Zetasizer Nano ZS90. The corresponding suspension conductivity values were 39.8 $\mu S$ to 307 $\mu S$, as a result of adding ammonium hydroxide to adjust the pH.

The concentration of the particle suspension has an important effect on the assembly rate, which is highly dependent on the particle concentration. A higher nanoelement concentration will produce a higher rate of migration, both electrophoretic and by diffusion or convection, than a lower concentration. The preferred range for particle concentration is from about 0.005 wt % ($\sim 10^{11}$ particles/ml) to about 1 wt % ($\sim 10^{14}$ particles/ml). Higher concentration ranges, such as from about 0.1 to about 10 wt % also can be used. Since assembly can be maintained using very slow removal from the solution, even without an applied voltage under certain conditions, the pulling speed of the patterned substrate through the suspension surface according to the invention (i.e., with applied voltage) can have a wide range from about 0.05 mm/min to about 5 mm/min, such as at least 1 mm/min, at least 3 mm/min, or at least 5 mm/min).

For methods of diffusion-controlled assembly, i.e., without the application of an electric field, chemical or physical surface treatments may be used in order to establish a pattern of assembly. For example, in U.S. Published Patent Application 2010-0183844A1 it was shown that treating the surface of a substrate to render it more hydrophilic could promote nanoelement assembly in the treated areas, while no assembly takes place in untreated areas. However, with the present method, highly specific patterned assembly is achieved according to the pattern established by the patterned layer. The patterned layer modifies the contours of the electric field according to its pattern, and therefore produces patterned assembly without the need for chemical or physical surface modification. Thus, in typical embodiments, the exposed surface of the insulating layer in the voids, where assembly takes place, is not modified, and has the same relative hydrophilicity or hydrophobicity as the surface of the patterned layer, where assembly does not take place. Nevertheless, the two methods can be combined, so that in other embodiments of the present invention the hydrophilicity or hydrophobicity, or other chemical or physical surface properties, can be modified so as to utilize two or more different driving forces for nanoelement assembly in a single operation.

FIG. 3 depicts a device for assembling nanoelements using a method of the present invention. Nanoelement assembly device 100 includes container 110 to accommodate suspension of nanoelements 120, counter electrode 130 disposed within the container, and movable platform 140 adapted for mounting patterned substrate 10, the movable platform attached to drive 150 capable of pulling the platform through a surface of the suspension at a speed adjustable from about 0.5 or less to about 10 mm/min or more. In some embodiments, the device also includes voltage source 160, and in some embodiments the device also includes controller 170 that can be used to set the voltage and/or the pulling speed according to user preferences which are input to the controller or provided by software that drives the controller. The device can be configured with electrical leads that connect the electrodes with the voltage source. The voltage source should be capable of delivering a constant DC voltage in the range from about 1V to at least about 200V. In some embodiments, the voltage source is capable of executing a programmed series of voltage changes over time. In some embodiments, the drive for pulling the substrate out of the suspension is programmable and is capable of executing a sequence of different pull speeds over time. The movable platform has a means for attaching the substrate, such as a clamp or clasp arrangement.

EXAMPLES

Example 1. Nanoparticle Assembly

A patterned substrate was prepared having vertically oriented nanotrenches. The trenches were 300 nm wide, 50 µm long, and 150 nm deep. The substrate was submerged into a suspension having wt % of 48 nm polystyrene latex nanoparticles (Thermoscientific) at a pH of 10.9. The counter electrode was placed at 5 mm from the substrate, and a voltage of 3.4V (positive at the substrate, negative at the counter electrode) as the substrate was pulled through the suspension surface at 3 mm/min using a KSV NIMA Dip Coater Single Vessel System. The assembly result is presented in FIGS. 4A and 4B, showing low and high magnification SEM images. The assembly (dark areas) covered nearly the entire substrate. The high magnification inset shows that the assembled nanoparticles completely filled the trenches and that assembly was limited to the trenches.

Example 2. Effect of Applied Voltage on Nanoparticle Assembly

Figure 5:
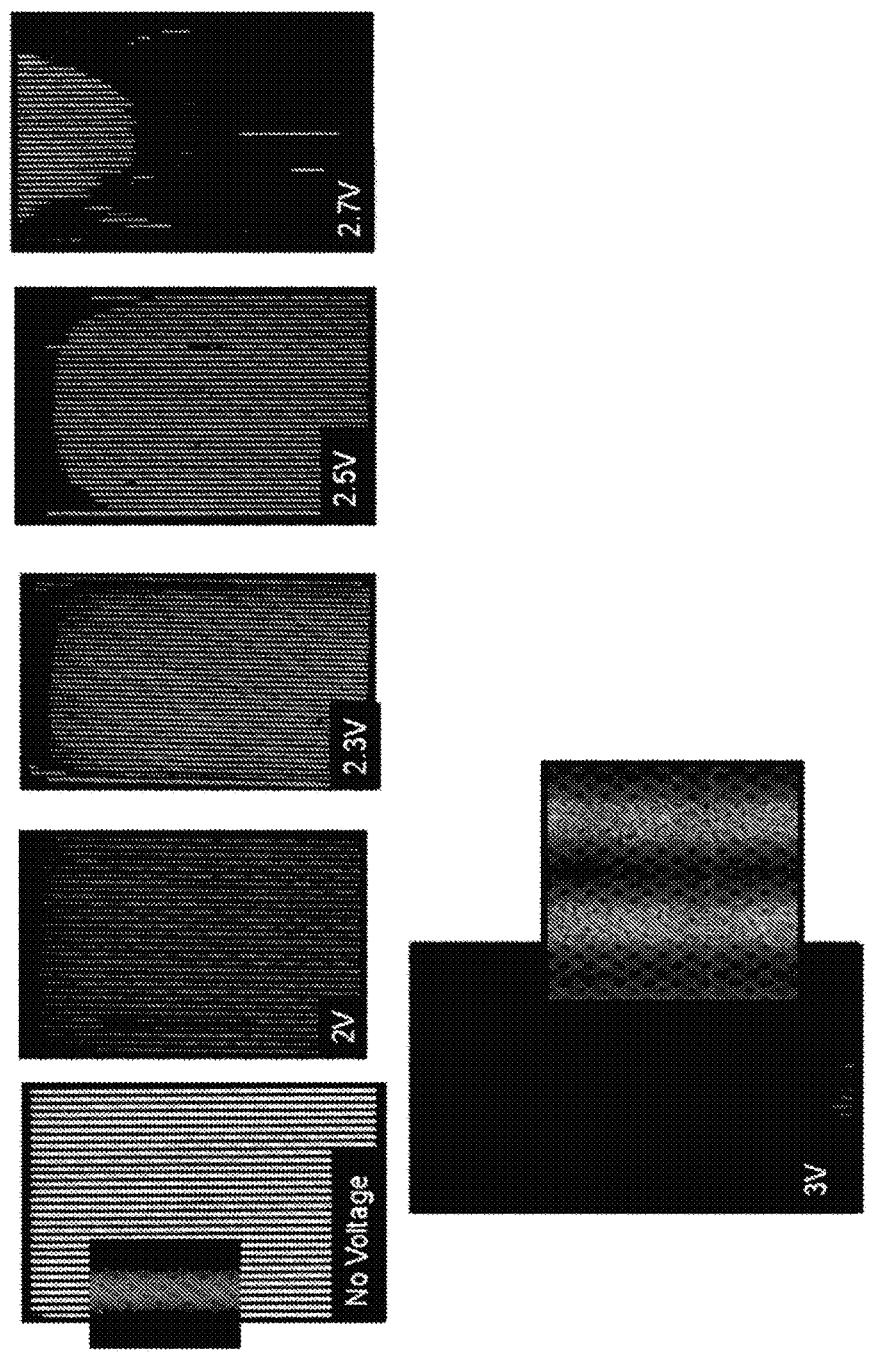
FIG. 5 shows SEM images for assembly performed at a pulling speed of 5 mm/min using the indicated voltages. The patterned substrate contained vertically oriented nanoscale trenches. Light gray regions indicate no assembly, and dark regions indicate assembly of polystyrene latex (PSL) nanoparticles. Inset panels at the 0V and 3V conditions are high magnification images showing no assembly at 0V and full assembly at 3V.

Nanoparticle assembly was carried out under the conditions of Example 1, but using a pull rate of 5 mm/min and varying the applied voltage as shown in the SEM images of FIG. 5. There was no assembly at 0V and 2V. Assembly started at 2.3V, increasing with voltage. Nearly complete assembly was obtained at 2.7V, and assembly was essentially 100% complete at 3V.

Example 3. Nanoparticle Assembly into Different Two Dimensional Void Patterns

Figure 6:
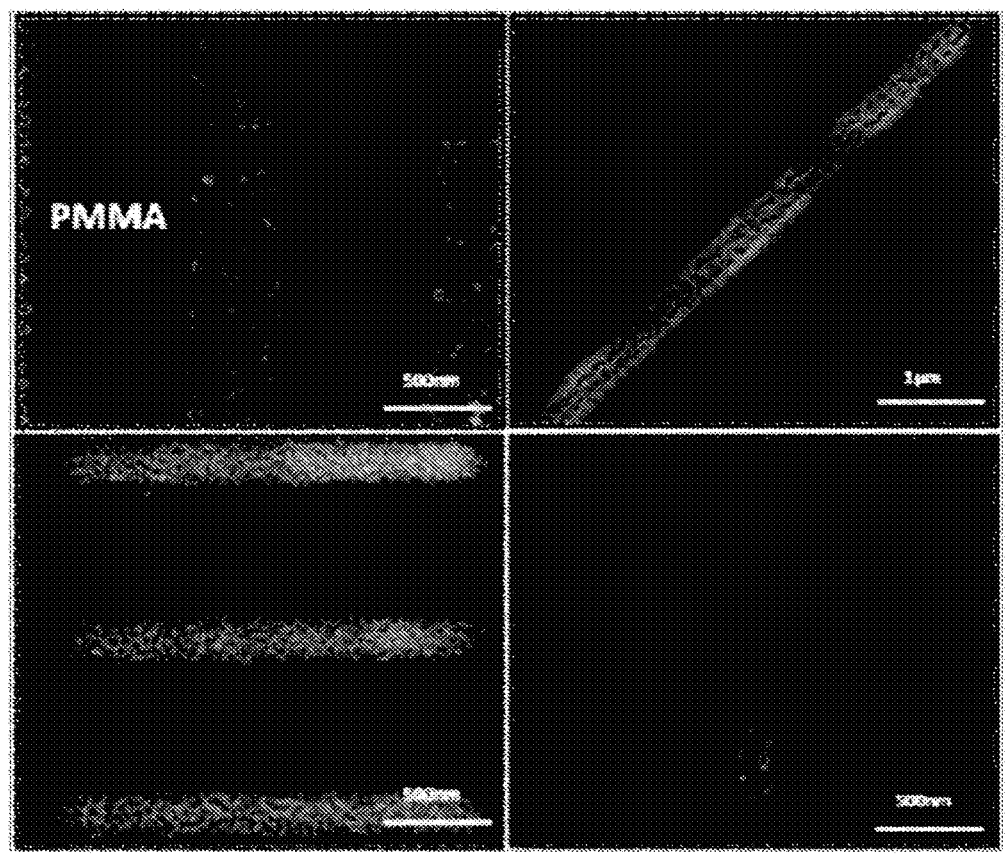
FIG. 6 shows assembly results visualized as SEM images for 50 nm PSL nanoparticles in nanotrenches having various orientations (vertical, diagonal, horizontal, intersecting) with respect to the surface of the nanoelement suspension.

Polystyrene latex nanoparticles (48 nm) were assembled in different void patterns, including nanotrenches (300 nm wide, 5 µm long, 150 nm deep) having vertical, horizontal, diagonal, and intersecting orientations, as shown in the SEM images of FIG. 6. The results confirmed that assembly can be completed with complete selectivity for the pattern voids in any two-dimensional pattern. For the experiments depicted in FIG. 6, the pull rate was 1-3 mm/min, the voltage was 2.9-3.1V, the nanoparticle concentration was 1 wt %, the pH was 10.9-11.1, and the counter electrode was 5 mm removed from the substrate.

Example 4. Electric Field Simulations

The electric field was simulated in order to investigate the effect of insulating layer thickness, distance from the insulating layer surface, and nanotrench morphology on the contours of the electric field applied during nanoelement assembly. The results are shown in FIGS. 7-10.

The commercial computational flow dynamics software FLOW-3D was used to simulate the electric field near the patterned substrate structure. The geometry was modeled as its actual size (no scaling). The electrical properties of the substrate and other component properties were input to the system according to references found from literature. The dielectric constant of the PMMA patterned layer was taken as 2.8, while that of the PECVD oxide insulating layer was taken as 3.9. The conductivity of the solution was assumed to be 100 µS. A mesh size of 300 nm was used generally, while for the sections that needed more accuracy, such as in the proximity of patterned structures, fixed points were used to decrease the mesh size at those locations. Boundary conditions were determined by first simulating the total area of one pattern (including 30-40 trenches) to find out how the electric potential changes between the electrodes. For an applied voltage of 2 to 4 V the electric potential at 30 µm from the insulating material was found to be 1.2 to 2.5 V, and these values were used as a boundary condition to simulate the exact electric field for one structure, such as a 300 nm wide×150 nm deep trench.

Figure 7:
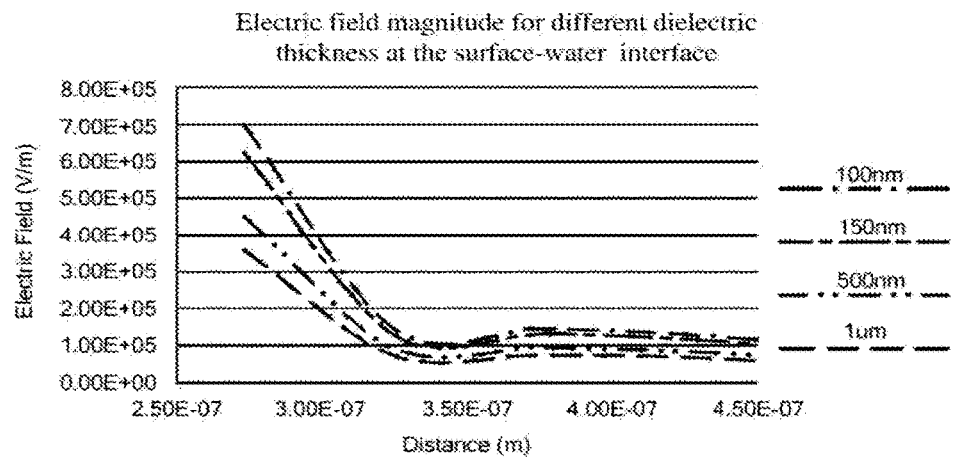
FIG. 7 shows the magnitude of the electric field as a function of the distance from the insulated surface for insulating layers of different thickness.
Figure 8:
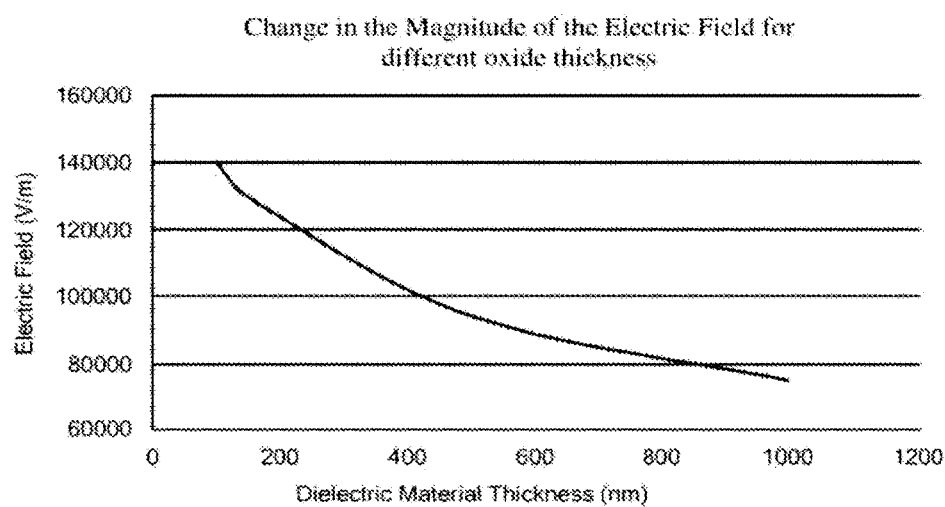
FIG. 8 shows the magnitude of the electric field as a function of the insulating layer thickness.

In FIG. 7 it can be seen that the field strength decreases as the thickness of the insulating layer increases from 100 nm to 1 µm. FIG. 8 shows how the field strength attenuates with distance from the surface of the insulating layer.

Figure 9:
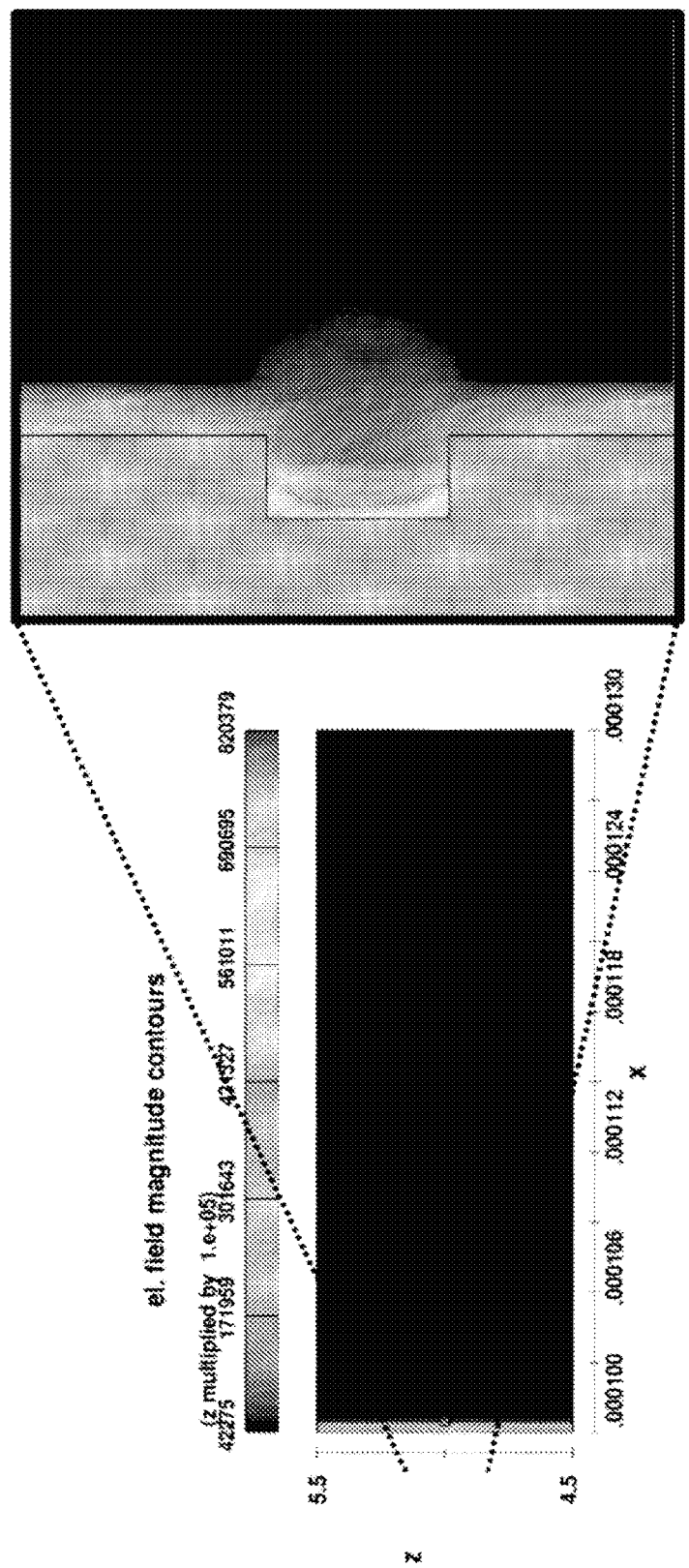
FIG. 9 shows the effect of nanoscale trench geometry of an insulated patterned substrate on the modeled electric field contours.
Figure 10:
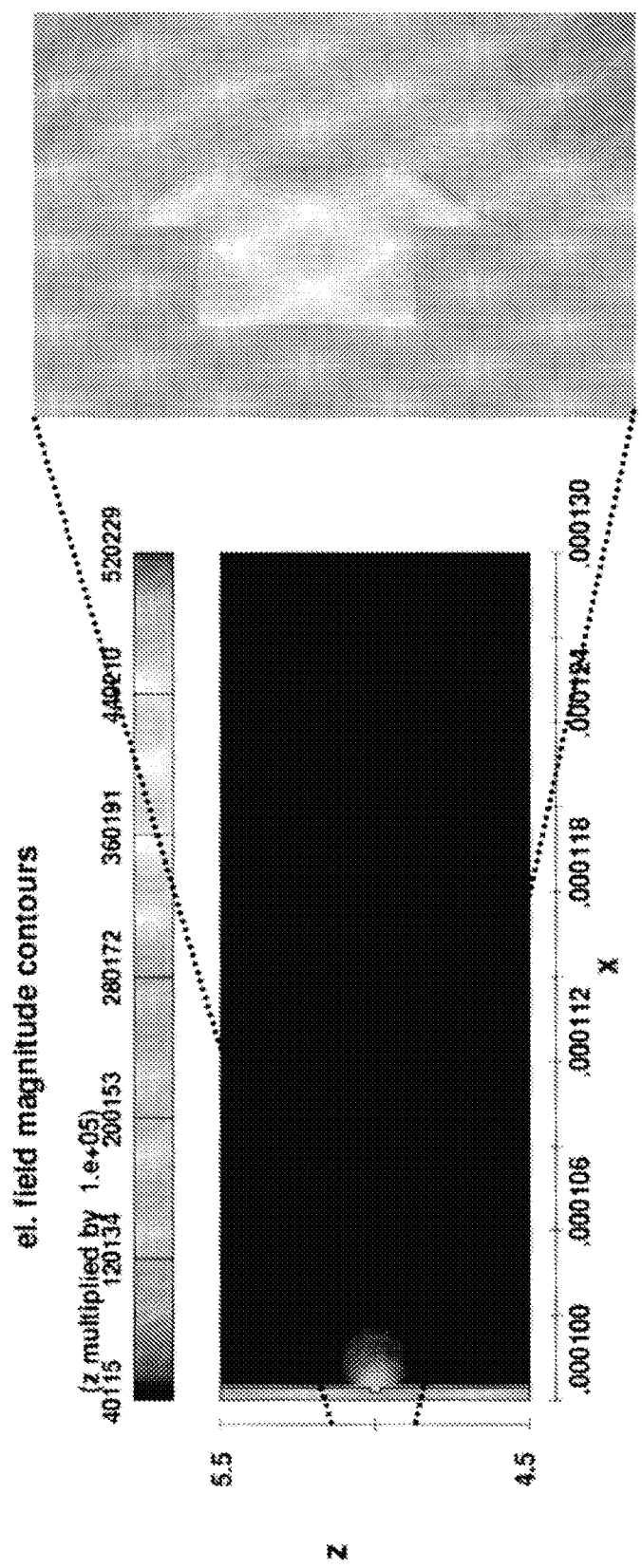
FIG. 10 shows the effect of nanoscale trench geometry on the modeled electric field contours for a non-insulated, bare gold conductor at the bottom of the trench.

FIG. 9 shows the electric field contours for a trench with an insulating layer of 150 nm thickness. FIG. 10 shows electric field contours for a trench with an exposed gold conductive layer (no insulating layer). Without the insulating layer, the electric field strength extends outward to the corners at the outer surface of the trench. However, with the insulating layer in place, the electric field is greatest at the bottom of the trench, especially at the corners.

REFERENCES

1. C. Talley, T. Huser, C. Hollars, L. Jusinski, T. Laurence, S. Lane, "Nanoparticle Based Surface-Enhanced Raman Spectroscopy", NATO Advanced Study Institute: Biophotonics Ottawa, Canada Sep. 29, 2004 through Oct. 9, 2004.
2. P. Yanez-Sedeno, J. M. Pingarron, Anal Bioanal Chem. 382 (2005) 884-886.
3. X. Xiong, P. Makaram, A. Busnaina, K. Bakhtari, S. Somu, N. McGruer Applied Physics Letters 89 (2006) 193108.
4. X. Xiong, L. Jabensari, M. G. Hahm, A. Busnaina, Y. J. Jung, Small 3 Issue 12 (2007) 2006-2010.
5. S. Choi, S. Stassi, A. P. Pisano, T. I. Zohdi, Langmuir 26(14) (2010) 11690-11698.
6. L. J. Ansari, M. G. Hahm, T. H. Kim, S. Somu, A. Busnaina, Y. J. Jung, Applied Physics A 131 (2009) 804.
7. S. Wu, T. P. Tang, W. J. Tseng, J Mater Sci 43 (2008) 6453-6458.
8. Y. Cui, M. T. Bjork, J. A. Liddle, C. Sonnichsen, B. Boussert, A. P. Alivisatos, NanoLetters 4 No. 6 (2004) 1093-1098.
9. F. Juillerat, H. S. Solak, P. Bowen, H. Hofmann, Nanotechnology 16 (2005) 1311-1316.
10. S. Y. Chou, P. R. Krauss, P. J. Renstrom; Science 5 Apr. 1996: Vol. 272 no. 5258 pp. 85-87.

That which is claimed is:

1. A device for assembling nanoelements, the device comprising a container for a suspension of nanoelements, a counter electrode disposed within the container, and a movable platform adapted for mounting a patterned substrate, the movable platform attached to a drive capable of pulling the platform through a surface of the suspension at a speed adjustable from about 0.5 to about 10 mm/min.

2. The device of claim 1 further comprising a voltage source configured to apply an electrical potential between the counter electrode and a conducting layer of the patterned substrate mounted on the movable platform.

3. The device of claim 2, wherein the voltage source is capable of delivering a constant DC voltage in a range from about 1V to at least about 200V.

4. The device of claim 2, wherein the voltage source is capable of executing a programmed series of voltage changes over time.

5. The device of claim 2, further comprising a controller for regulating the voltage source in response to input from a user or a software program.

6. The device of claim 1, wherein the drive for pulling the substrate out of the suspension is programmable and is capable of executing a sequence of different pull speeds over time.

7. The device of claim 6, further comprising a controller for regulating the drive in response to input from a user or a software program.

8. The device of claim 1 further comprising the patterned substrate attached to the movable platform.

9. The device of claim 8, further comprising a plurality of assembled nanoelements contained within one or more voids of the patterned substrate.

10. The device of claim 8 further comprising a voltage source having one output attached to the counter electrode and the other output attached to a conductive layer of the patterned substrate.

11. The device of claim 1 configured to perform a method of assembling nanoelements, the method comprising the steps of:
(a) providing the patterned substrate comprising a base layer of insulating material, a metal conductive layer deposited onto the base layer, an insulating layer deposited onto the conductive layer, and a patterned layer deposited onto the insulating layer, wherein the patterned layer is interrupted according to a pattern that defines one or more voids in the patterned layer, wherein the patterned layer forms walls of the voids and the insulating layer forms a bottom of the voids;
(b) submerging at least a portion of the substrate in a liquid suspension of nanoelements, the liquid suspension disposed within the container and having a surface interfacing with a gaseous medium; and
(c) pulling the substrate from the liquid suspension through the surface thereof while applying an electrical potential between the conductive layer of the substrate and the counter electrode in the suspension; whereby the nanoelements from the suspension are assembled in the voids of the patterned substrate.

* * * * *